United States Patent

Fuller

[15] 3,657,029

[45] Apr. 18, 1972

[54] PLATINUM THIN-FILM METALLIZATION METHOD

[72] Inventor: Clyde R. Fuller, Plano, Tex.

[73] Assignee: Texas Instruments Incorporated, Dallas, Tex.

[22] Filed: Dec. 31, 1968

[21] Appl. No.: 788,187

[52] U.S. Cl. ....156/11, 117/212, 117/213, 117/217, 117/221, 156/17, 156/18

[51] Int. Cl. ....C23f 1/02, B44d 1/18, C23b 5/64

[58] Field of Search ....156/3, 7, 8, 11, 13, 18; 117/212, 213, 217, 221, 49, 50, 130 E; 29/577–578, 589–590; 174/68.5

[56] References Cited

UNITED STATES PATENTS

| | | | |
|---|---|---|---|
| 3,236,708 | 2/1966 | Tillis | 156/11 |
| 3,256,588 | 6/1966 | Sikina et al. | 156/17 X |
| 3,290,753 | 12/1966 | Chang | 156/17 X |
| 3,367,806 | 2/1968 | Cullis | 156/17 |
| 3,424,627 | 1/1969 | Michel et al. | 156/17 X |
| 3,444,015 | 5/1969 | Baker et al. | 156/11 |
| 3,492,179 | 1/1970 | Gaze | 156/18 |

*Primary Examiner*—Harold Ansher
*Assistant Examiner*—Joseph C. Gil
*Attorney*—James O. Dixon, Andrew M. Hassell, Harold Levine, Melvin Sharp, John E. Vandigriff, Henry T. Olsen, Michael A. Sileo, Jr. and Gary C. Honeycutt

[57] ABSTRACT

Platinum thin-film metallization is selectively etched with aqua regia, using a chromium or titanium film as an etch-resistant mask. In a specific embodiment, an integrated circuit structure is metallized with successive layers of titanium, platinum, gold and a metal selected from molybdenum, tungsten, rhenium and corrosion-resistant alloys thereof. The system is particularly suited for the formation of insulated "-cross-over" metallization, or multi-level interconnecting metallization.

10 Claims, 4 Drawing Figures

PATENTED APR 18 1972

3,657,029

Figure 1:
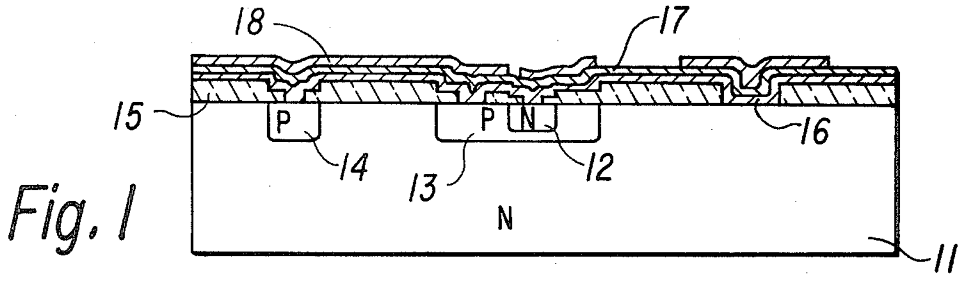

INVENTOR
CLYDE R. FULLER

BY Gary C. Honeycutt

ATTORNEY

PLATINUM THIN-FILM METALLIZATION METHOD

This invention relates to the fabrication of electrical contacts and interconnecting metallization systems for semiconductor devices. More particularly, the invention is directed to a method for the selective etching of platinum thin films and to a novel metallization system comprising successive layers of titanium, platinum and gold, adapted for use with second level or multi-level electrical interconnections.

The "beam lead" system, a well-known metallization for semiconductor devices, is deposited and patterned on a standard slice of planar devices after the contact holes have been etched through the passivating oxide layer. Platinum silicide ohmic contacts are formed in the contact holes, followed by a sputtered deposition of titanium and platinum layers on the oxide, and then the selective etching of platinum layers on the with aqua regia, using a photoresist layer as a mask. The mask is then removed and replaced with a reverse pattern of photoresist, through which the gold beams are electrodeposited, followed by selective chemical etching to remove excess titanium.

Etch-resistant masking patterns are then developed on the reverse side of the semiconductor slice, in registry with the metallized patterns on the other side. The unmasked silicon is then etched away, leaving the individual devices with beam leads cantilevered beyond the edges of the slice. Isolation trenches are thus provided in integrated circuits, thereby replacing isolation diffusions or solid dielectric isolation. In summary, the beam leads are batch-fabricated as an integral part of the semiconductor device, integrated circuit or other component, to serve as structural supports for the chips, as well as electrical contacts.

Although the beam lead system possesses superior corrosion-resistance, it has had limited application because of problems relating to contact geometry formation and to metallurgical instability. In addition, the poor adhesion of deposited silicon dioxide on gold has rendered the system incompatible with conventional techniques for building second level and higher levels of integrated circuit electrical interconnections. Specifically, successful contact geometry formation in platinum has required exacting conditions of platinum deposition parameters, etch composition, and the application and handling of photo-resist films. The platinum film has had to be of low density so as to facilitate etching. The photo-resist had to be carefully hardened to produce maximum resistance to hot aqua regia. Further, pattern development had to be perfectly clean to insure etching of the platinum. Finally, the aqua regia had to be formulated with a low nitric acid content in order to reduce its tendency to attack the photo-resist.

Normally, the underlying titanium film must remain intact to provide electrical continuity for the electro-deposition of gold, but when the nitric acid content of aqua regia is low, the titanium may fail to passivate and therefore etch inadvertently along with the platinum film. Both chromium and titanium effectively resist attack by normal aqua regia compositions, due to the formation of inert oxides by reaction with the nitric acid contained therein.

Accordingly, it is an object of the invention to provide an improved method of contact geometry formation in a platinum-comprising microelectronic metallization system. It is a further object of the invention to adapt a titanium-platinum-gold metallization system and technique for use in second level and multi-level electrical interconnections in the fabrication of integrated circuits.

The invention is embodied in a method for selectively etching a platinum film, beginning with the step of deposing a film of chromium or titanium on the platinum film. The chromium or titanium is then selectively etched to form a mask having the same pattern as desired in the platinum. The masked platinum surface is then contracted with aqua regia to remove the exposed platinum, followed by the step of removing the mask.

The platinum and the chromium or titanium are deposited in accordance with any suitable method, including vacuum evaporation or sputtering. Suitable techniques for the selective etching of chromium or titanium are also known to the art. A preferred technique for patterning a chromium film is to apply a photo-resist pattern having the same configuration as ultimately desired in the platinum, followed by the step of etching the exposed chromium in an aqueous sulfuric acid solution containing ceric sulphate and nitric acid, at a temperature of about 40° C. A titanium mask is patterned using a suitable photo-resist mask and an etch solution containing dilute hydrochloric or sulfuric acid, and a small amount of hydrofluoric acid. Once the chromium or titanium mask pattern is completed, the exposed portion of the platinum film is contacted with aqua regia. Effective ratios of hydrochloric acid to nitric acid are known in the art. A ratio of 3/1, for example, has been found particularly suitable. After the platinum is etched, any remaining photo-resist is removed, followed by the removal of the chromium or titanium using, for example, the same etch solution as employed to pattern the chromium or titanium mask.

The invention is also embodied in an integrated circuit structure including a monocrystalline semiconductor body having a first windowed insulation layer on a surface thereof, covered by a plurality of metallization levels, spaced apart by an insulation layer between each pair of adjacent levels. The first metallization level includes a first layer of titanium covered by platinum, then gold, and then a metal selected from molybdenum, tungsten and rhenium or a corrosion-resistant alloy of any of these last three metals. A second windowed insulation layer covers the first metallization level and the second level of metallization covers the second insulation layer. The second metallization level establishes electrical contact through windows at selected locations in the second insulation layer. Successive levels of metallization may be of any suitable composition or combination of layers compatible with requirements for conductivity, metallurgical stability, and adhesion to deposited insulations. However, the choice criteria should include corrosion resistance, since it is primarily this characteristic of the Ti-Pt-Au system that make it desirable for use as a multilevel metallization. Therefore, logically, successive metallization levels are usually identical to the first, with similar forming processes being necessary.

Typically, the monocrystalline semiconductor body is silicon, having a first insulation layer of silicon dioxide on a surface thereof, the silicon dioxide having windows therein exposing selected areas of the silicon surface for ohmic contact. Platinum silicide ohmic contacts are then formed by techniques well known to the art. Thereafter, the titanium-platinum-gold and the molybdenum, tungsten or rhenium may be deposited in accordance with known techniques.

However, in accordance with a further aspect of the invention, an improved method is provided for the fabrication of an integrated circuit structure as defined above. The initial step involves the formation of platinum silicide or other suitable ohmic contacts, followed by the step of sequentially depositing layers of titanium, platinum and chromium or titanium on the windowed insulation layer to establish contact with the ohmic contact areas at the window locations. The chromium or titanium surface layer is then selectively etched to provide therein the same pattern as desired in the platinum layer. Using the patterned chromium or titanium layer as a mask, the platinum layer is selectively etched, followed by removal of the metal mask. The initial titanium layer is then selectively etched to provide therein the same pattern as in the platinum. A layer of gold and then a layer of a refractory metal selected from molybdenum, tungsten and rhenium or alloy thereof, is deposited on the gold. The gold and the refractory metal layers are then selectively etched to provide therein the same pattern as in the remaining metal layers. A second insulation layer is then deposited to cover the metal layers and the first insulation layer. Windows are selectively etched in the second insulation layer at locations where electrical contact with underlying metallization is desired. A second metallization level is then deposited on the windowed second insulation layer to establish contact with the underlying metallization. Finally, the second level metallization is patterned to provide the desired geometry.

The resistance of the chromium or titanium mask to aqua regia is such that high-density platinum of greater thickness can be employed, relative to the previous practice. The resulting increase in metallurgical stability allows further process modifications, not only facilitating application of the titanium-platinum-gold system to complex integrated circuits, but, with the deposition of molybdenum, tungsten or rhenium over the gold, extension of this corrosion-resistant system to devices requiring multi-level electrical interconnections is permitted.

The prior practice, following the platinum etch, was to remove the photo-resist employed for that operation and to apply a reverse pattern of photo-resist. Gold was then electrodeposited through the resist mask to thicknesses that were frequently incompatible with metallurgical stability, for the express purpose of forming "beams" of gold as device mounting and contact areas. The result was a thick, vertically-sided gold interconnection pattern, incompatible with the fabrication of second level interconnections. The higher density, thicker platinum films permissible with the application of the present invention provide metallurgical stability compatible with thinner vacuum-deposited gold films. The subsequent deposition of molybdenum, tungsten or rhenium provides an adhesion base for surface protection, or for second level insulation oxide. Contact geometry may then be formed by conventional photo-resist and selective etching techniques to yield metal configurations compatible with second level crossover continuity.

A further benefit gained from the use of this invention with the titanium-platinum-gold system stems from differences between surface reflectivities of the platinum and the chromium. Extraneous exposure of contact photo masking materials always occurs to some degree because of scattered reflection from multi-level device surfaces. When the metal is highly reflective, the photo-resist is sufficiently exposed to result in contact "bridging." The lower reflectivities of a chromium layer over platinum reduces the problem.

FIGS. 1 through 4 are cross-sectional views of a semiconductor structure, illustrating successive stages in fabricating the preferred embodiment of the invention.

FIGURE 1

Silicon wafer 11 is processed by any suitable technique to provide therein the indicated regions of n-type and p-type conductivity. The structure illustrated is a portion of an integrated circuit structure to be provided with the necessary metal interconnection system. An n-p-n transistor is formed by emitter 12 and base 13, in combination with substrate 11 which serves as a collector region. P-type region 14 is a resistor element to be connected electrically with transistor base region 13. An insulating layer 15, typically silicon dioxide, for example, covering the surface of wafer 11 acquires a stepped configuration, as shown, during successive diffusion operations. Thereafter, openings or windows are selectively etched in the oxide layer to permit ohmic contact with each of the respective conductivity regions by the first metallization level. Also, the silicon surfaces exposed by the ohmic holes in oxide layer 15 are converted to platinum silicide (not shown) for the purpose of improving ohmic contact with the first metallization level.

Next, titanium layer 16, platinum layer 17, and chromium layer 18 are deposited by known techniques, including, for example, vacuum evaporation or sputtering. Chromium layer 18 is then selectively etched to provide the appropriate pattern for use as a mask in the subsequent etching of platinum layer 17. For example, the chromium layer is first covered with a suitable photo-resist composition which is selectively exposed to a suitable light source and then developed to provide the exact pattern required. A suitable etchant for the removal of the exposed chromium pattern is the aqueous ceric sulphate-sulfuric acid-nitric acid mixture mentioned above. For example, the solution is prepared from 50 of 0.5 N ceric sulfate in 2 N sulfuric acid, and 35 ml. concentrated nitric acid, diluted with water to yield 135 ml. of etchant solution.

The structure shown in FIG. 1 is then immersed in aqua regia for the purpose of removing the exposed portions of platinum layer 17. The aqua regia does not appreciably attack the chromium mask, or titanium layer 16, due to the passivating effect of oxides initially formed upon reaction with the nitric acid contained in aqua regia. After the aqua regia etch, the chromium mask is removed with the ceric sulphate solution, for example, followed by a selective etching of the undesired portions of titanium layer 16 using, for example, an etchant solution comprising hydrochloric acid containing a small amount of hydrofluoric acid to activate the titanium by removing any oxide coating formed upon contact with the aqua regia.

FIGS. 2–4

Figure 2:
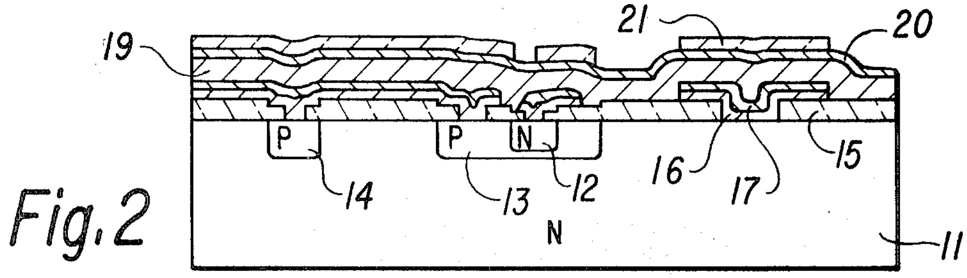

In FIG. 2, the resulting pattern formed in the titanium and platinum layers is shown, including subsequently-deposited gold layer 19 and molybdenum layer 20. As before, the gold and molybdenum layers are deposited in accordance with known techniques, such as vacuum evaporation or sputtering. A selective mask 21 of a suitable photo-resist is then patterned on molybdenum layer 20 in the same configuration as previously provided in the chromium. The molybdenum and gold layers are then selectively etched using, for example, potassium ferricyanide and alcoholic iodine-potassium iodide, respectively, and the photo-resist is then removed.

Figure 3:
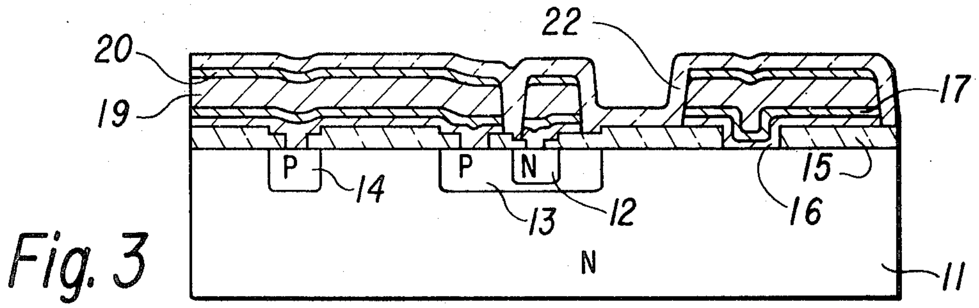

The resulting titanium-platinum-gold molybdenum metallization is then covered with a suitable insulating material 22 such as silicon dioxide, which may be deposited using known techniques, including, for example, the decomposition of tetraethylorthosilicate vapors, or the oxidation of silane. The resulting structure is shown in FIG. 3.

Figure 4:
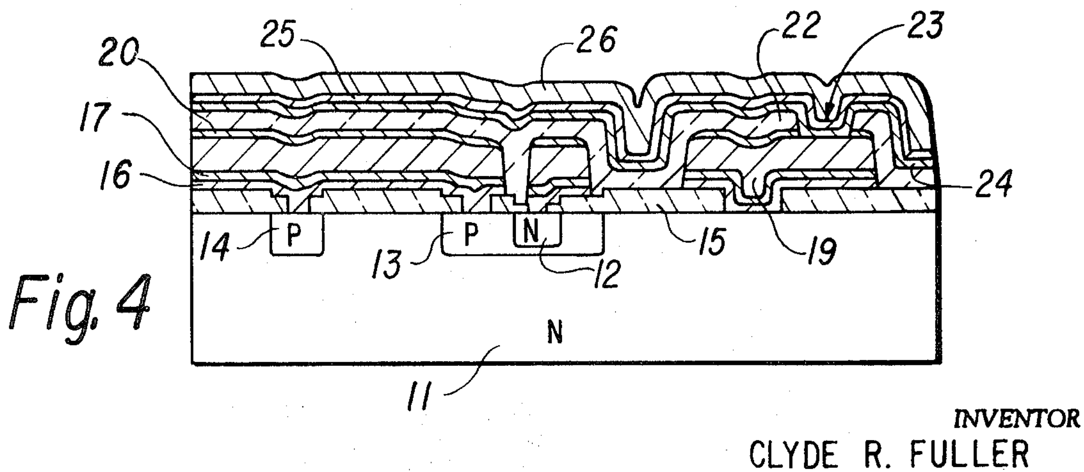

Oxide layer 22 is then selectively etched to provide a window 23 for iinterconnection between the first and second levels of metallization. Titanium interconnection 24, platinum layer 25, and gold layer 26 are then deposited in accordance with known techniques, similarly as in he case of the first level metallization. The resulting completed structure is shown in FIG. 4.

Although each of the above embodiments is described with the use of platinum as the preferred metal of the platinum-palladium group, it will be apparent that other metals may be substituted therefor, including palladium, rhodium, ruthenium, osmium and iridium, but not necessarily with equivalent results.

What is claimed is:

1. A method for metallizing a microelectronic semiconductor structure having a first insulation layer on a surface thereof, said first insulation layer having windows therein exposing selected areas of said semiconductor surface for ohmic contact, comprising:

a. sequentially deposing a first layer of titanium and then a layer of a metal of the platinum-palladium group on the windowed insulation layer, then depositing a layer of chromium or a second layer of titanium on the metal of the platinum-palladium group;
b. selectively etching the chromium layer or second titanium layer to provide therein the same pattern as desired in the layer of platinum-palladium group metal;
c. selectively etching the platinum-palladium group metal layer, with the patterned chromium or second titanium layer serving as a mask;
d. removing the chromium or titanium mask;
e. selectively etching the first titanium layer to provide therein the same pattern as in the platinum-palladium group metal;
f. depositing a layer of gold and then a layer of a refractory metal selected from molybdenum, tungsten and rhenium or an alloy thereof; g. selectively etching the gold and refractory metal layers to provide therein the same pattern as in the remaining metal layers;

h. depositing a second insulation layer to cover said metal layers and said first insulation layer;

i. selectively etching windows in said second insulation layer at locations where electrical contact with underlying metallization is desired;

j. depositing a metal layer on said windowed second insulation layer to establish contact with the underlying metallization; and k. patterning the metal layer on said second insulation layer.

2. A method as defined by claim 1 wherein the platinum-palladium group metal is platinum.

3. A method as defined by claim 2 wherein the deposited masking layer is chromium.

4. The method defined in claim 3 wherein the chromium layer is selectively etched with an etchant solution comprising ceric sulfate, sulfuric acid and nitric acid.

5. A method as defined by claim 3 wherein said refractory metal is molybdenum.

6. A method as defined by claim 5 wherein said second insulation layer is silicon oxide.

7. A method as defined by claim 6 wherein said metal layer on said windowed second insulation layer is chromium or titanium.

8. A method as defined by claim 6 wherein said metal layer on said windowed second insulation layer is comprised of successive layers of titanium, platinum and gold.

9. A method for metallizing a semiconductor structure having a first insulation layer on a surface thereof, said first insulation layer having openings therein exposing the semiconductor surface, comprising:

a. sequentially forming a first layer of titanium and then a layer of a metal selected from the platinum-palladium group over the insulation layer, then forming a layer of chromium or a second layer of titanium on the metal of the platinum-palladium group;

b. selectively removing the chromium or second titanium layer to define a desired pattern therein;

c. selectively removing the platinum-palladium group layer from the regions defined by said pattern;

d. removing the chromium or second titanium layer;

e. selectively removing the first titanium layer from the regions defined by said pattern;

f. sequentially forming a layer of gold and then a layer of a refractory metal over the platinum-palladium group layer; and g. selectively removing the gold and refractory metal layers from the regions defined by said pattern.

10. The method of claim 9 further comprising forming a second insulation layer over the metal layers, selectively removing the second insulation layer from the regions defined by said pattern, and forming a metal layer over said insulation layer.

* * * * *